US006203965B1

(12) United States Patent
Cameron et al.

(10) Patent No.: US 6,203,965 B1
(45) Date of Patent: Mar. 20, 2001

(54) PHOTORESIST COMPRISING BLENDS OF PHOTOACID GENERATORS

(75) Inventors: James F. Cameron, Cambridge; James Michael Mori, Boston; George W. Orsula, Harvard; James W. Thackeray, Braintree, all of MA (US); Wu-Song Huang, Poughkeepsie, NY (US); Ronald A. DellaGuardia, Poughkeepsie, NY (US); Kuang-Jung Chen, Poughkeepsie, NY (US); Hiroshi Ito, San Jose, CA (US); Wayne M. Moreau, Wappingers Falls, NY (US)

(73) Assignees: Shipley Company, L.L.C., Marlborough, MA (US); IBM Corporation, Armonk, NY (US)

( * ) Notice: Subject to any disclaimer, the term of this patent is extended or adjusted under 35 U.S.C. 154(b) by 0 days.

(21) Appl. No.: 09/552,211

(22) Filed: Apr. 19, 2000

Related U.S. Application Data

(63) Continuation of application No. 09/253,171, filed on Feb. 20, 1999.

(51) Int. Cl.⁷ .................................................. G03F 7/004
(52) U.S. Cl. ........................ 430/270.1; 430/325; 430/914
(58) Field of Search ............................ 430/270.1, 325, 430/914

(56) References Cited

U.S. PATENT DOCUMENTS

| 5,322,765 | 6/1994 | Clecak et al. ............... 430/326 |
| 5,498,765 | 3/1996 | Carpenter, Jr. et al. ........ 430/323 |
| 5,532,106 | 7/1996 | Frechet et al. .............. 430/191 |
| 5,595,855 | 1/1997 | Padmanaban et al. .......... 430/270.1 |
| 5,731,364 | 3/1998 | Sinta et al. ................. 522/31 |
| 5,817,444 | * 10/1998 | Sato et al. ................. 430/155 |
| 6,037,107 | * 3/2000 | Thackeray et al. ............ 430/326 |

FOREIGN PATENT DOCUMENTS

| 780732 | * 6/1997 | (EP) . |
| 0 831 369 A2 | 3/1998 | (EP) . |
| 677788 | * 2/1999 | (EP) . |
| 0 898 201 A1 | 2/1999 | (EP) . |
| 908473 | * 4/1999 | (EP) . |
| 908783 | * 4/1999 | (EP) . |
| 955562 | * 11/1999 | (EP) . |
| 955563 | * 11/1999 | (EP) . |
| 985974 | * 3/2000 | (EP) . |

OTHER PUBLICATIONS

Database WPI, Section Ch, Week 199542, Derwent Publication Ltd., London GB; Class A21, AN 1995–323797; XP002127118 & JP 07 219216 A (Nippon Kayaku KK), Aug. 18, 1995 (Aug. 18, 1995).

Allen et al., "193 nm Single Layer Positive Resists", SPIE vol. 2438, Feb. 20–22, 1995, pp. 474–485.

* cited by examiner

*Primary Examiner*—Janet Baxter
*Assistant Examiner*—Rosemary Ashton
(74) *Attorney, Agent, or Firm*—Peter F. Corless; Darryl P. Frickey; Edwards & Angell, LLP

(57) ABSTRACT

The invention provides new photoresist compositions that contain a resin binder and a blend of photoacid generators. Photoacid generator blends of the invention produce photoacids that differ in acid strength and/or size. A specific composition comprises a terpolymer having units of hydroxystyrene, styrene and t-butyl acrylate with the photoacid generators di-(4-tbutylphenyl)iodonium camphorsulfonate and di-(4-t-butylphenyl)iodonium o-trifluoromethylbenzene sulfonate.

4 Claims, No Drawings

PHOTORESIST COMPRISING BLENDS OF PHOTOACID GENERATORS

This application is a continuation of Ser. No. 09/253,171 filed Feb. 20, 1999.

BACKGROUND OF THE INVENTION

1. Field of the Invention

This invention relates to new photoresist compositions that contain a blend of photoacid generator compounds. Compositions of the invention are highly useful as deep U.V. photoresists.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

Relatively recently interest has increased in photoresists that can be photoimaged with deep U.V. radiation. Such photoresists offer the potential of forming images of smaller features than may be possible at longer wavelength exposure. As is recognized by those in the art, "deep U.V. radiation" refers to exposure radiation having a wavelength in the range of about 350 nm or less, more typically in the range of about 300 nm or less. While a number of deep U.V. resists have been reported, the need clearly exists for new deep U.V. resists that can provide highly resolved fine line images as well as acceptable photospeed and other lithographic properties. Particular interest exists in resists that can be imaged with sub-250 nm wavelengths such as KrF radiation (ca. 248 nm) or sub-200 nm wavelengths such as ArF radiation (193 nm).

SUMMARY OF THE INVENTION

We have now discovered novel blends or mixtures of photoacid generators compounds ("PAGs") that can formulated in photoresist compositions to provide excellent lithographic properties, particularly chemically-amplified positive-acting resists. Preferred PAG blends can be photoactivated upon exposure to deep U.V. radiation, particularly 248 nm.

In a first aspect of the invention, PAG blends are provided that photogenerate acids of differing strengths. More particularly, preferred PAG blends comprise at least one PAG that generates a strong acid upon photoactivation, and at least one PAG that generates a comparatively weak acid upon photoactivation. Typically, the "strong" and "weak" photogenerated acids of the blend differ in pKa values (determined by Taft parameter calculation as discussed in detail below) by at least about 1 or 1.5, more typically a pKa difference of at least about 2 or more. A typical "strong" photogenerated acid of a blend of the invention has a pKa (Taft parameter calculation) of about −1 or less, more typically a pKa of about −2, −3 or lower. A typical "weak" photogenerated acid of a blend of the invention has a pKa (Taft parameter calculation) of about −2, −1, 0 or higher.

For instance, illustrative preferred "strong" photogenerated acids include perfluorinated alkylsulfonic acids e.g. perfluorooctanesulfonic acid, perfluorohexanesulfonic acid, perfluorobutanesulfonic acid, perfluoro(4-ethyl) cyclohexanesulfonic acid, trifluoromethanesulfonic acid and the like. Additional suitable "strong" photogenerated acids include aromatic sulfonic acids that are substituted with electron withdrawing groups such as fluoro, nitro, cyano and trifluoromethyl. Suitable "strong" photogenerated acids for use in the blends of the invention may include pentafluorobenzenesulfonic acid, 2-trifluoromethylbenzenesulfonic acid, 3-trifluoromethylbenzenesulfonic acid, 4-trifluoromethylbenzenesulfonic acid, and bis(trifluoromethyl)benzenesulfonic acid, particularly 3,5-bis (trifluoromethyl) benzenesulfonic acid.

Preferred "weak" photogenerated acids include e.g. alkylsulfonic acids that are not substituted with electron withdrawing groups such as fluoro, or have minimal electron withdrawing group substitution, e.g. only one or two electron withdrawing substituents. Cycloalkylsulfonic acids are particularly suitable "weak" acids, such as cyclohexanesulfonic acid, adamantanesulfonic acid, camphor sulfonic acid and the like. PAGs that may be employed to provide such acids include e.g. onium salts such as iodonium salts, sulfonium salts and the like; imidosulfonates; sulfonate esters; and non-ionic halogenated compounds that generate a halo-acid (e.g. HBr) upon photoactivation.

In a further aspect, the invention provides PAG blends that generate acids of differing size upon photoactivation. More specifically, in this aspect of the invention, preferred PAG blends comprise at least one PAG that generates a "large" acid upon photoactivation, and at least one PAG that a comparatively "small" acid upon photoactivation. Typically, the "large" and "small" photogenerated acids of the blend differ in size by at least about 25 or 30 cubic angstroms (i.e. $\text{Å}^3$), more typically by at least about 40 or 50 cubic angstroms (i.e. $\text{Å}^3$). A typical "large" photogenerated acid of a blend of the invention has a volume of at least about 155 or 160 $\text{Å}^3$), more preferably a volume of at least about 170, 180 or 190 $\text{Å}^3$. A typical "small" photogenerated acid of a blend of the invention has a volume of about less than 155 or 150 $\text{Å}^3$, more preferably a volume of about 130 or 140 $\text{Å}^3$ or less. Sizes of photogenerated acids may be readily determined by standard computer-based analyses, as are well-known and further discussed below.

PAG blends also are provided that combine both aspects of the invention, where the blend comprises PAGs that generate acids that differ both in acid strength and size. For example, PAG blends are provided that comprise at least one PAG that generates upon photoactivation a strong acid that is large (or small), and at least one PAG that generates upon photoactivation a weak acid that is small (or large if the strong acid is small).

However, in at least some aspects of the invention, it is preferred that two PAGs of a blend differ only in either size or strength of the photogenerated acid. Thus, e.g., in this aspect of the invention, if the blend members generate photoacids that differ in size as discussed above, then those photogenerated acid have similar acid strengths, e.g. a pKa (Taft parmater calculation) difference of 0.5 or less.

Similarly, in this aspect of the invention, if the blend members generate photoacids that differ in strength as discussed above, then those photogenerated acid have similar size, e.g. less than about 25 or 20 Å³ difference in size.

Without being bound by theory, it is believed that larger photogenerated acids will diffuse more slowly (relative to a small acid) through a photoresist layer after exposure and prior to development. Such diffusion, particularly into unexposed resist layer areas, can limit resolution of the developed image. It is also believed that a strong photogenerated acid can provide enhanced photospeed (relative to a weak acid).

It has been found that selective blending of members of a PAG mixture of the invention can provide the optimal balance of properties selected for a particular resist containing the PAG blend.

Photoresist compositions are also provided that comprise a PAG blend of the invention. PAG blends of the invention can be used in a variety of resist systems. In particular, PAG blends of the invention are preferably formulated in chemically-amplified positive-acting resists, where the resist contains a polymer with photoacid-labile groups, particularly pendant acid-labile groups such as can be provided by condensation of alkyl acrylate monomers, e.g. an alkyl acrylate-phenol copolymer, or a polymer that contains alkyl acrylate repeat units and that is essentially or completely free of phenyl or other aromatic units. Unless otherwise indicated, the term acrylate as used herein refers to vinyl esters in general, including substituted compounds such as methacrylate and the like.

It has been that photoresist compositions that contain PAG blends of the invention can impart significantly improved lithographic properties to the resist. See, for instance, the comparative results set forth in Examples 2, 3 and 4 which follow. Among other things, it has been found that resists of the invention can provide highly resolved resist relief images on substrates recognized to compromise resolution, such as boron phosphorus silicate glass. See the results set forth in Example 4 which follows.

The invention also provide methods for forming relief images of the photoresists of the invention, including methods for forming highly resolved patterned photoresist images (e.g. a patterned line having essentially vertical sidewalls) of sub-micron and even sub-half micron dimensions.

The present invention ether provides articles of manufacture comprising substrates such as a microelectronic wafer or a flat panel display substrate having coated thereon the photoresists and relief images of the invention. Other aspects of the invention are disclosed infra.

References herein to pKa values of photoacids designate values determined by Taft parameter analysis, as such analysis is known in this field and described in J. Cameron et al., "Structural Effects of Photoacid Generators on Deep UV Resist Performance," *Society of Plastic Engineers, Inc. Proceedings.*, "Photopolymers, Principles, Processes and Materials, 11th International Conference, pp. 120–139 (1997); and J. P. Gutthrie, *Can. J. Chem.*, 56:2342–2354 (1978). References herein to sizes of photoacids designate volumetric size as determined by standard computer modeling, which provides optimized chemical bond lengths and angles. A preferred computer program for determining photoacid size is Alchemy 2000, available from Tripos. For a further discussion of computer-based determination of photoacid size, see T. Omote et al., *Polymers for Advanced Technologies*, "Photoreactive Fluorinated Polyimide Protected by a Tetrahydropyranyl Group Based on Photoinduced Acidolysis", volume 4, pp. 277–287.

DETAILED DESCRIPTION OF THE INVENTION

As discussed above, in a first aspect PAG blends are provided that photogenerate acids of differing strengths e.g. as assessed by pKa values. In a further aspect, PAG blends are provided that generate upon photoactivation acids of differing size.

A variety of PAGs can be employed in the PAG blends and photoresist compositions of the invention.

Onium salts are generally preferred PAGs for use in accordance with the invention. Examples of suitable onium salts include for example, halonium salts, quaternary ammonium, phosphonium and arsonium salts, aromatic sulfonium salts and sulfoxonium salts or selenium salts. Onium salts have been described in the literature such as in U.S. Pat. Nos. 4,442,197; 4,603,101; and 4,624,912.

Generally preferred onium salts include iodonium salt photoacid generators, such as those compounds disclosed in published European application 0 708 368 A1. Such salts include those represented by the following formula:

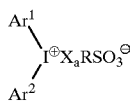

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substituent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom. Suitable anion substituents R include e.g. R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Two particularly suitable iodonium PAGs are the following PAGS 1 and 2:

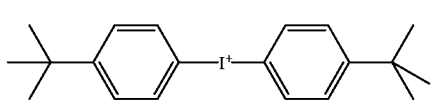

1

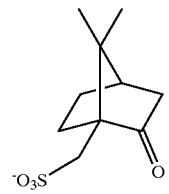

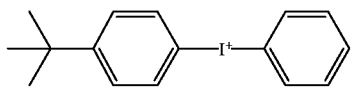

2

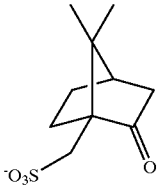

Such compounds can be prepared as disclosed in European Patent Application 96118111.2 (publication number 0783136), which details the synthesis of above PAG 1.

Also suitable are the above two iodonium compounds complexed with anions other than the above-depicted camphor sulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Sulfonium salts are particularly suitable photoacid generators for PAG blends and resists of the invention, such as compounds of the following formula:

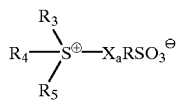

wherein $R^3$, $R^4$ and $R^5$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$ a haloalkyl group, a $C_{5-8}$ cycloalkyl group and a $C_{1-8}$ alkylthio group. Two of $R^3$, $R^4$ and $R^5$ may be connected to each other via its single bond or a substituent R of the above sulfonium formulae may be the same as defined above for the iodonium PAGs 1 and 2, i.e. adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Additional preferred photoacid generators for use in the blends and resists of the invention include imidosulfonates such as compounds of the following formula:

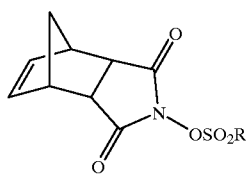

wherein each $R^1$ and $R^{1'}$ are each independently hydrogen or $C_{1-12}$ alkyl, more preferably hydrogen or methyl; and R is alkyl (e.g. $C_{1-12}$ alkyl), camphor, adamantane and other cycloalkyl typically having from 5 to about 12 ring members, and perfluoroalkyl such as perfluoro($C_{1-12}$alkyl), particularly perfluorinated groups such as perfluorooctanesulfonate, perfluorobutanesulfonate and the like. R of that formula may be the same as defined above for the iodonium and sulfonium PAGs. A specifically preferred photoacid generator of this class is N-[(perfluorooctane sulfonyl)oxy]-5-norbornene-2,3-dicarboximide.

N-sulfonyloxyimide photoacid generators also are suitable for use in PAG blends and compositions of the invention, including those N-sulfonyloxyimides disclosed in International application WO94/10608, such as compounds of the following formula:

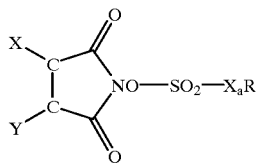

where the carbon atoms form a two carbon structure having a single, double or aromatic bond, or, alternatively, wherein they form a three carbon structure, that is, where the ring is instead a five member or six member ring; R is $-C_nH_{2n+1}$ where n=1 to 8, $-C_nF_{2n+1}$ where n=1 to 8, a camphor substituent, -2(9,10 -diethoxyanthracene), $-(CH_2)_n-Z$ or $-(CF_2)_n-Z$ where n=1 to 4 and where Z is H, $C_{1-6}$ alkyl, a camphor substituent, -2-(9,10-diethoxyanthracene, or aryl such as phenyl; X and Y (1) form a cyclic or polycyclic ring which may contain one or more hetero atoms, or (2) form a fused aromatic ring, or (3) may be independently hydrogen, alkyl oraxyl, or (4) may be attached to another sulfonyloxy-imide containing residue, or (5) may be attached to a polymer chain or backbone, or alternatively, form

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and $OCH_3$ where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

In certain embodiments of the invention, such N-sulfonyloxyimides are excluded from PAG blends and resists of the invention, or at least such N-sulfonyloxyimides are excluded from use in combination with a sulfonium salt PAG, particularly a triphenyl sulfonium salt, or in combination with an iodonium salt PAG, particularly a diphenyl iodonium salt PAG. In certain embodiments, excluded from PAG blends and resists of the invention will be mixtures of diphenyl-iodonium triflate, di-(t-butylphenyl)iodonium triflate, or phthalimide triflate.

Another class of photoacid generators suitable for use in the blends and resists of the invention include diazosulfonyl compounds such as those disclosed in U.S. Pat. No. 5,558, 976. Representative examples of these photoacid generators include:

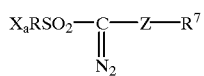

where R suitably is phenyl optionally substituted by halogen, $C_{1-8}$ alkyl, $C_{1-8}$ alkoxy, or $C_{1-8}$ haloalkyl; $C_{1-8}$ alkyl; $C_{1-8}$ alkoxy; or $C_{1-8}$ haloalkyl; $R^7$ may be the same (e.g. symmetrical compound where Z is sulfonyl) or different than R and in addition to the groups specified for R, $R^7$ may be a straight-chain, branched or cyclic alkyl group having from 1 to 10 carbon atoms and Z is a sulfonyl group or a carbonyl group:

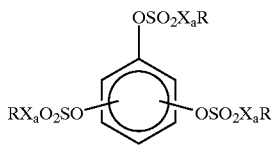

where R is as defined above; and

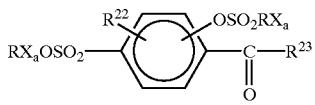

where $R^{22}$ is hydrogen, hydroxyl or a group represented by the formula $RSO_2O-$ where R is as defined above, and $R^{23}$ is a straight or branched alkyl group having from 1 to 5 carbon atoms or a group represented by the formula:

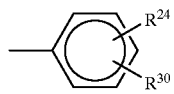

where $R^{24}$ and $R^{30}$ are independently a hydrogen atom, a halogen atom, a straight chain or branched alkyl group having 1–5 carbon atoms, a straight chain or branched alkoxy group having 1–5 carbon atoms, or a group of the formula:

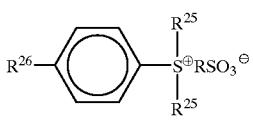

where each $R^{25}$ is independently a straight chain or branched alkyl group having 1–4 carbon atoms, a phenyl group, a substituted phenyl group or an aralkyl group; and $R^{26}$ is a hydrogen atom, hydroxy, a halogen atom or a straight-chain, branched or cyclic alkyl group having 1–6 carbon atoms, or alkoxy suitably having 1–6 carbons.

Nitrobenzyl-based photoacid generators may also be employed as a PAG components of the blends and resists of the invention, including those disclosed in EPO published application No. EP 0 717 319 A1. Suitable nitrobenzyl-based compounds include those of the following formula:

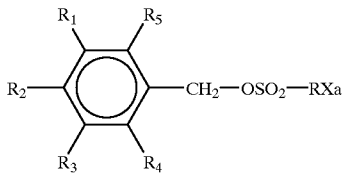

where each $R_1$, $R_2$ and $R_3$ are individually selected from the group consisting of hydrogen and lower alkyl group having from 14 carbon atoms; and $R_4$ and $R_5$ are individually selected from the group consisting of $CF_3$ and $NO_2$ and R is optionally substituted carbocyclic aryl, particularly optionally substituted phenyl such as phenyl where the 2, 3, and 4 position substituents are selected from hydrogen and $C_{1-4}$ alkyl and where the 5 and 6 ring positions are selected from $CF_3$, $NO_2$ and $SO_3R'$ where R' of optionally substituted $C_{1-12}$ alkyl or aryl such as phenyl where such optional substituents may be $C_{1-4}$ alkyl, $C_{1-4}$ alkoxy, $NO_2$ or $CF_3$.

Disulfone derivatives are also suitable non-ionic photoacid generators for use in accordance with the invention. Suitable compounds are disclosed e.g. in published European application 0 708 368 A1. Such materials may be represented by the following formula:

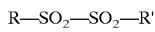

wherein R and R' may each be the same or different and may each be the same as defined above for R, or R may be $Ar^3$ where each Ar independently represents a substituted or unsubstituted aryl group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

Halogenated non-ionic, photoacid generating compounds are also suitable for use in blends and resists of the invention and include, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-bromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris(trichloromethyl)triazine.

PAG blends of the invention may contain more than two different PAGs, e.g. where multiple PAGs of a single class or type are present in a resist formulation. However, it is often preferred that a PAG blend consist of no more than two distinct photoacid generators.

Some specifically preferred photoacids of PAG blends and resists of the invention are shown immediately with pKa values (Taft parameter calculation) and/or volumetric size values ($Å^3$) listed immediately below the acid.

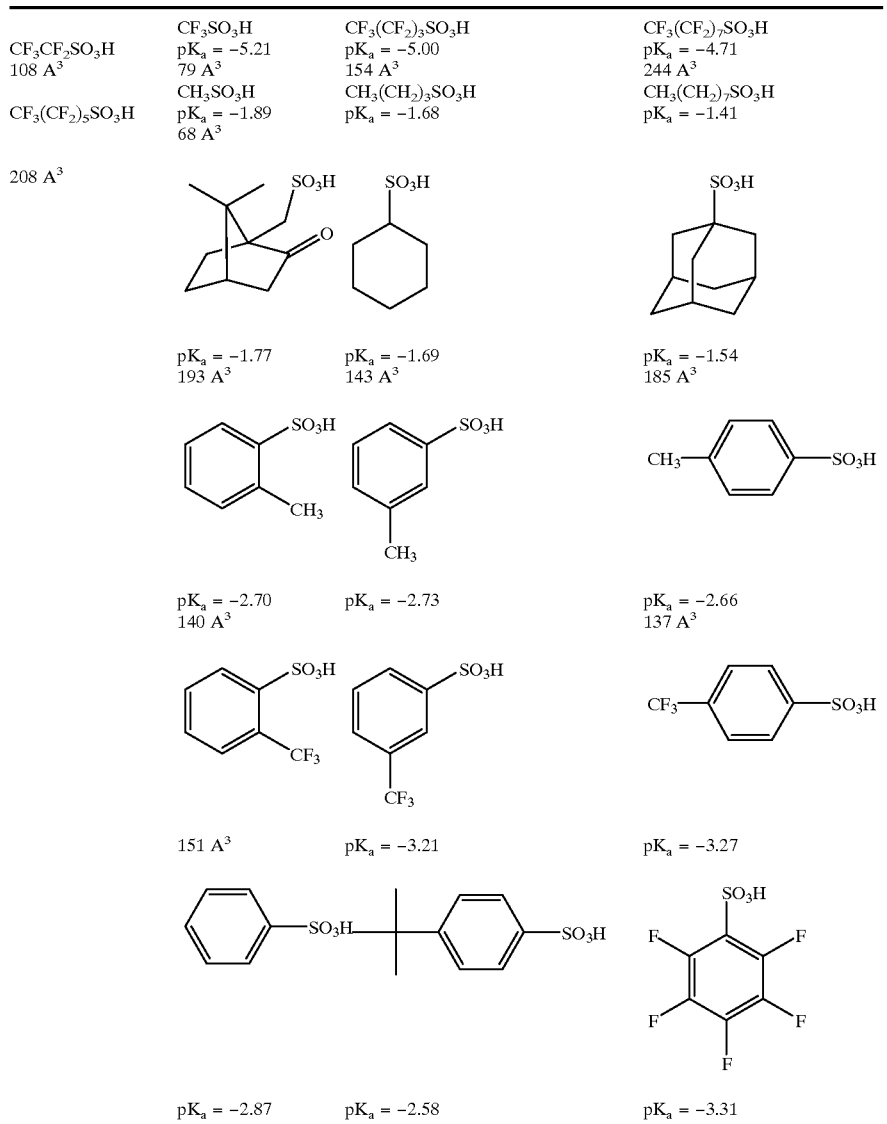

As discussed above, a PAG blend of the invention is preferably used in positive-acting chemically amplified resist compositions. Such compositions comprise a dissolution inhibitor component, e.g. a resin with photoacid labile moieties.

The dissolution inhibitor component may contain any of a variety of acid labile groups, such as acid sensitive esters, carbonates, acetals, ketals and the like, which suitably may be pendant from a polymer backbone. Acid-labile groups that are integral to the polymer backbone also may be employed. Preferred deblocking resin binders have also been disclosed in European Patent Published Application EP0813113A1, European Patent Application 97115532 (corresponding to U.S. Pat. No. 5,861,231), and U.S. Pat. No. 5,258,257 to Sinta et al. Suitable deblocking resins and use of same in chemically amplified photoresists also have been described in U.S. Pat. Nos. 4,968,581; 4,883,740; 4,810,613; 4,491,628 and 5,492,793.

Preferred deblocking resins for use in the resists of the invention include polymers that contain both phenolic and non-phenolic units. For example, one preferred group of such polymers has acid labile groups substantially, essentially or completely only on non-phenolic units of the polymer. One preferred polymer binder has repeating units x and y of the following formula:

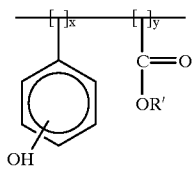

wherein the hydroxyl group be present at either the ortho, meta or para positions throughout the polymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the polymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, of the acrylate units serves as the acid labile groups of the resin and will undergo photoacid induced cleavage upon exposure of a coating layer of a photoresist containing the resin. Preferably the copolymer will have a Mw of from about 3,000 to about 50,000, more preferably about 10,000 to about 30,000 with a molecular weight distribution of about 3 or less, more preferably a molecular weight distribution of about 2 or less. Such copolymers also may be prepared by such free radical polymerization or other known procedures and suitably will have a Mw of from about 3,000 to about 50,000, and a molecular weight distribution of about 3 or less, more preferably a molecular weight distribution of about 2 or less.

Additional preferred deblocking resins have acid labile groups on both phenolic and non-phenolic units of the polymer. One preferred polymer binder has repeating units a, b and c of the following formula:

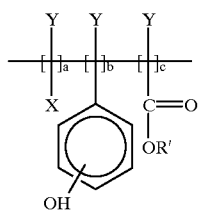

wherein R' group is a photoacid labile group as defined above for the other preferred polymer, X is another repeat unit which may or may not contain a photoacid labile group; and each Y is independently hydrogen or $C_{1-6}$ alkyl, preferably hydrogen or methyl. The values a, b and c designate the molar amount of the polymer units. Those polymer units may be regularly alternating in the polymer, or may be randomly interspersed through the polymer. Suitable X groups may be aliphatic or aromatic groups such as phenyl cyclohexyl, adamantyl, isobornylacrylate, methacrylate, isobornylmethacrylate, and the like. Such polymers may be formed in the same manner as described for the polymer above, and wherein the formed copolymer is reacted to provide the phenolic acid labile groups.

Additional preferred deblocking resins include at least three distinct repeating units of 1) units that contain acid-labile groups; 2) units that are free of reactive groups as well as hydroxy groups; and 3) aromatic or other units that contribute to aqueous developability of a photoresist containing the polymer as a resin binder. Particularly preferred deblocking polymers of this type correspond to the following Formula I:

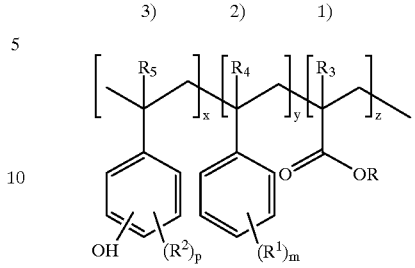

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to about 8 ring members per ring. For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a Piety of substituted or unsubstituted vinylphenyl monomers during the polymer synthesis.

$R^2$ groups of units 3) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkynyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in Formula I) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in Formula I above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$ of Formula I above) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc. Typically a substituted moiety is substituted at one, two or three available positions.

In the above Formula I, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Preferred copolymers of the above Formula I include those where the only polymer units correspond to the general structures of units 1), 2) and 3) above and the sum of the mole percents x, y and z equals one hundred. However, preferred polymers also may comprise additional units wherein the sum of x, y and z would be less than one hundred, although preferably those units 1), 2) and 3) would still constitute a major portion of the copolymer, e.g. where the sum of x, y and z would be at least about 50 percent (i.e. at least 50 molar percent of the polymer consists of units 1), 2) and 3)), more preferably the sum of x, y and z is at least 70 percent, and still more preferably the sum of x, y and z is at least 80 or 90 percent. See European Published Patent Application EP 0813113A1 for detailed disclosure of free radical synthesis of copolymers of the above Formula I.

Additional resin binders include those that have acetalester and/or ketalester deblocking groups. Such resins are disclosed in EP 0829766A2 of the Shipley Company and U. Kumar. For instance, suitable resins include terpolymers formed from hydroxystryene, styrene and acid labile components such as 1-propyloxy-1-ethylmethacylate and the like.

Additional preferred polymers are disclosed in copending and commonly assigned U.S. application Ser. No. 09/143,462, filed on Aug. 28, 1998, now U.S. Pat. No. 6,136,501.

Polymers of the invention can be prepared by a variety of methods. One suitable method is free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperature may vary depending on the reactivity of the particular reagents employed and the boiling point of the reaction solvent (if a solvent is employed). Suitable reaction solvents include e.g. tetrahydrofuran, dimethylformamide and the like. Suitable reaction temperatures for any particular system can be readily determined empirically by those skilled in the art based on the present disclosure. Monomers that can be reacted to provide a polymer of the invention can be readily identified by those skilled in the art based on the present disclosure. For example, suitable monomers include e.g. acrylate, including methacrylate, t-butylacrylate, acrylonitrile, methacrylonitrile, itaconic anhydride and the like. A variety of free radical initiators may be employed to prepare the copolymers of the invention. For example, azo compounds may be employed such as azo-bis-2,4-dimethylpentanenitrile. Peroxides, peresters, peracids and persulfates also could be employed.

Unless indicated otherwise above, a polymer used as a resin binder component of a resist of the invention typically will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Preferred polymers also will exhibit a sufficiently high $T_g$ to facilitate use of the polymer in a photoresist. Thus, preferably a polymer will have a $T_g$ greater than typical softbake (solvent removal) temperatures, e.g. a $T_g$ of greater than about 100° C., more preferably a $T_g$ of greater than about 110° C., still more preferably a $T_g$ of greater than about 120° C.

For 193 nm imaging applications, preferably a resist resin binder component will be substantially free of any phenyl or other aromatic groups. For example, preferred polymers for use in 193 imaging contain less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged 193 nm.

Photoresists of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components. A preferred additive is a basic compound, such as tetrabutylammonium hydroxide (TBAH), tetrabutylammonium late, or tetrabutylammonium acetate, which can enhance resolution of a developed image. For resists imaged at 193 nm, a preferred added base is a hindered amine such as diazabicycloundecene, diazabicyclononene or di-terbutylethanolamine. Such an amine may be suitably present in amount of about 0.03 to 5 to 10 weight percent, based on total solids (all components except solvent) of a resist composition.

The PAG blend component should be present in a photoresist formulation in amount sufficient to enable generation of a latent image in a coating layer of the resist. More specifically, the PAG blend will suitably be present in an amount of from about 0.5 to 40 weight percent of total solids of a resist, more typically from about 0.5 to 10 weight percent of total solids of a resist composition. The distinct PAGs of a blend suitably may be present in about equivalent molar amounts in a resist composition, or each PAG may be present in differing molar amounts. It is typically preferred however that each class or type of PAG is present in an amount of at least about 20 to 25 mole percent of total PAG present in a resist formulation.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist.

The photoresists of the invention are generally prepared following known procedures with the exception that a photoactive component of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether, propylene glycol monomethyl ether acetate; lactates such as ethyl lactate or methyl lactate, with ethyl lactate being preferred, proponiates, particularly methyl propionate, ethyl propionate and ethyl ethoxy propionate; a Cellosolve ester such as methyl Cellosolve acetate; an aromatic hydrocarbon such toluene or xylene; a ketone such as methylethyl ketone or cyclohexanone; and the like. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate suitably can be any substrate used in processes involving photoresists such as a microelectronic wafer. For example, the substrate can be a silicon, silicon dioxide or aluminum—aluminum oxide microelectronic wafer. Gallium arsenide, ceramic, quartz or copper substrates may also be employed. Substrates used for liquid crystal display and other flat panel display applications are also suitably employed, e.g. glass substrates, indium tin oxide coated substrates and the like. As discussed above, it has been found that highly resolved resist relief images can be formed on substrates that can be difficult to pattern fine images, such as boron phosphorus silicate glass. A liquid coating resist composition may be applied by any standard means such as spinning, dipping or roller coating.

Also, rather than applying a resist composition directly onto a substrate surface, a coating layer of an antireflective coating composition may be first applied onto a substrate surface and the photoresist coating layer applied over the underlying antireflective coating. A number of antireflective coating compositions may be employed including the compositions disclosed in European Applications Publication Nos. 0542008A1 and 0813114A2, both of the Shipley Company. For resists to be imaged at 248 nm, an antireflective composition that contains a resin binder with anthracene units preferably may be employed.

The exposure energy should be sufficient to effectively activate the photoactive component of the radiation sensitive system to produce a patterned image in the resist coating layer. Suitable exposure energies typically range from about 10 to 300 mJ/cm$^2$. An exposure wavelength in the deep U.V. range often preferably will be used for the photoresists of the invention, particularly exposure wavelengths of sub-250 nm or sub-200 nm such as about 248 nm or 193 nm. Preferably, the exposed resist coating layer will be thermally treated after exposure and prior to development, with suitable post-exposure bake temperatures being from about e.g. 50° C. or greater, more specifically from about 50 to 160° C. After development, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLE 1

Resist preparation (comparative resists and resist of the invention)

Three photoresist compositions were prepared and are referred herein as Resists 1, 2 and 3 respectively. Each of Resists 1, 2 and 3 had the following same components: 1) terpolymer resin having polymerized units of hydroxystyrene, styrene and tert-butyl acrylate; 2) additives of tetrabutylammonium hydroxide (0.3 wt. % of terpolymer), a calixresorcinarene (3 wt. % of terpolymer), and surfactant (Silwet L7604 at 0.5 wt. % of total solids). Resist 1 (comparative) contained a single PAG of di-(4-t-butylphenyl)iodonium camphorsulfonate PAG (5 wt. % of polymer). Resist 2 contained a PAG blend that consisted of the two compounds of di-4-t-butylphenyl)iodonium camphorsulfonate PAG (at 2.5 wt. % of polymer) and di-(4-t-butylphenyl)iodonium o-trifluoromethylbenzenesulfonate PAG (at 2.5 wt. % of polymer). Resist 3 (comparative) contained a single PAG of di-(4-t-butylphenyl)iodonium o-trifluoromethylbenzenesulfonate PAG (at 5 wt. % of polymer).

Each of Resists 1, 2 and 3 were prepared at 16 wt. % solids with a solvent of ethyl lactate, rolled to dissolve, and then filtered to 0.2 μm.

EXAMPLE 2

Lithographic results

The lithographic evaluation of these resists was performed and analyzed as follows.

Resists 1, 2 and 3 were at room temperature and coated over an organic antireflective composition coating that had been coated onto unprimed silicon wafers and baked at 225° C. for 60 seconds yielding a 600 angstrom film of the antireflective composition coating layer. Resists 1, 2 and 3 were coated to provide approximately 6000 angstrom resist coating after a softbake of 130° C. for 60 seconds. Eo photospeed was determined by exposing a coated wafer of each resist with a 0.1–10.0 mJ/cm$^2$ dose range using an open-field mask on a GCA XLS7800 Deep UV Stepper (248.4 nm krypton fluoride laser, 0.53 numerical aperture, 0.74 partial coherence). Each exposed film was post-exposure baked at 130° for 90 seconds and then developed with Ad-10 (2.38% T developer for 40 seconds in double puddle mode (20/20 sec. process). The EO photospeeds of Resists 1, 2 and 3 were 4.3, 3.8, and 3.3 mJ/cm$^2$, respectively. The resists were then tested for imaging performance by producing dense and isolated contact hole features over an exposure range beginning at 3 X EO, incrementing at 0.1 X EO (for 16 steps), and ending at approximately 4.6 X EO, and over a focus range of 1.8 μm, centered at the machine-determined 0 focus, with 0.15 um increments. The imaged wafers were analyzed for exposure latitude (EL) for 0.25 μm 1:1 contact holes via scanning electron microscopy (SEM). Results are set forth in Table 1 immediately below.

TABLE 1

(Energies in mJ/cm$^2$)

| Sample | Eo | E0.22 | E0.20 (Esize) | E0.18 | EL | Es/E0 |
|---|---|---|---|---|---|---|
| Resist 1 | 4.3 | 15.96 | 15.03 | 14.10 | 12.4% | 3.50 |
| Resist 2 | 3.8 | 14.58 | 13.60 | 12.61 | 14.5% | 3.58 |
| Resist 3 | 3.3 | 13.00 | 12.49 | 11.98 | 8.2% | 3.79 |

2. Focus latitude.

Focus latitude analysis was performed over the 0.2 μm target CD of the contact holes for each of Resists 1, 2 and 3. Results are set forth in Table 2 immediately below.

TABLE 2

| Sample | Focus Latitude 0.25 um Contact Holes |
|---|---|
| Resist 1 | 0.35 um |
| Resist 2 | 0.75 um |
| Resist 3 | 0.5 um |

As can be seen from Tables 1 and 2, Resist 2, which contained a PAG blend of the invention showed the highest exposure latitude and focus latitude. Hence, that resist of the invention offers an improved lithographic process window.

EXAMPLE 3

Additional lithographic results

Two photoresists were pried and are referred to herein as Resists 4 and 5. Each of Resists 4 and 5 had the following same components: 1) terpolymer resin having polymerized units of hydroxystyrene, styrene and tert-butyl acrylate; 2) additives of tetrabutylammonium hydroxide (0.125 wt. % of terpolymer), and surfactant (Fluorad FC430 at 0.1 wt. % of total solids). Resist 4 (comparative) contained a single PAG of di-4t-butylphenyl)iodonium o-trifluoromethylbenzenesulfonate PAG (2 wt. % of polymer). Resist 5 contained a PAG blend that consisted of the two compounds of di-(4-t-butylphenyl)iodonium camphorsulfonate PAG (0.76 wt % of polymer) and di-(4-t-butylphenyl)iodonium o-trifluoromethylbenzenesulfonate PAG (1.25 wt. % of polymer).

Each of Resists 4 and 5 were prepared at 16 wt. % solids with a solvent of ethyl lactate, rolled to dissolve, and then filtered to 0.2 μm.

Resist 4 and 5 were each coated, soft-baked, imaged to 248 mm radiation, post-exposure baked and developed as described in Example 2 above. The Resists 4 and 5 were exposed to provide for both 0.25 μm and 0.20 μm line/space (l/s) pairs and isolated lines (Iso). Exposure latitude results are set forth in Table 3 below.

TABLE 3

| Sample | 1:1 0.25 μm l/s | Iso 0.25 μm | 1:1 0.20 μm l/s | Iso 0.20 μm |
|---|---|---|---|---|
| Resist 4 | 7.9% | 10.5% | 2.7% | 2.2% |
| Resist 5 | 14.1% | 13.0% | 8.3% | 8.7 |

As can be seen from the results in Table 3 above, Resist 5 (containing a PAG blend of the invention) showed significantly improved exposure latitude relative to Resist 4, particularly for smaller features where extension of the process window (e.g. exposure latitude) can be critical. In addition, Resist 5 showed significantly higher quality relief image profiles relative to Resist 4.

EXAMPLE 4

Boron Phosphorus Silicate Glass Substrate Application

Three photoresist compositions were prepared and are referred to herein as Resists 6, 7 and 8. Each of Resists 6, 7, 8 contained a copolymer resin that 65 mole percent hydroxystyrene units and 35 mole percent of tert-butyl acrylate units; tetrabutylammonium hydroxide at 0.4 wt. % relative to polymer weight; Silwet L7604 at 0.4 weight % relative to total solids. Resist 6 contained a PAG of di-(4-tert-butylphenyl)iodonium camphorsulfonate at 5 weight % relative to the resin Resist 7 contained a PAG blend that consisted of 2.5 weight % relative to the resin of di-(4-tert-butylphenyl)iodonium camphorsulfonate and 2.5 weight % relative to the resin of di-(4-tert-butylphenyl)iodonium perfluorooctanesulfonate. Resist 8 contained a PAG blend that consisted of 1 weight % relative to the resin of di-(4-tert-butylphenyl)iodonium camphorsulfonate and 4 weight % relative to the resin of di-(4-tert-butylphenyl)iodonium perfluorooctanesulfonate.

Each of Resists 6, 7 and 8 were prepared at 16 wt. % solids with a solvent of ethyl lactate, rolled to dissolve, and then filtered to 0.2 μm, and then coated onto boron phosphorus silicate glass substrates and baked at 130° C. for 60 seconds, exposed at 248 nm, 150° C./90 second postexposure bake and 30 second/30 second double puddle alkaline aqueous solution development Resists 7 and 8 provided faster photospeeds (relative to Resist 6), no footing of the developed 0.25 μm contact hole relief image and greatly reduced standing waves on boron phosphorus silicate glass substrates. The relief image of comparative Resist 6 showed significant footing and severe standing waves.

The foregoing description of the invention is merely illustrative thereof, and it is understood that variations and modifications can be effected without departing from the spirit or scope of the invention as set forth in the following claims.

What is claimed is:

1. A photoresist composition comprising:
   1) a terpolymer resin having polymerized units of hydroxystyrene, styrene and tert-butyl acrylate; and
   2) a mixture of photoacid generator compounds consisting of i) di-(4-t-butylphenyl)iodonium camphorsulfonate and ii) di-4-t-butylphenyl)iodonium o-trifluoromethylbenzene sulfonate, the mixture present in an amount sufficient to permit development of an exposed coating layer of the composition.

2. A method for forming a photoresist relief image on a substrate comprising:
   (a) applying a coating layer of a photoresist composition of claim 1 on a substrate; and
   (b) exposing the photoresist coating layer to patterned activating radiation and developing the exposed photoresist layer to provide a relief image.

3. An article of manufacture comprising a substrate having on at least one surface a coating layer of the photoresist composition of claim 1.

4. The article of claim 3 wherein the substrate is a microelectronic wafer substrate or a flat panel display substrate.

* * * * *